United States Patent [19]

Ovshinsky et al.

[11] 4,217,374
[45] Aug. 12, 1980

[54] AMORPHOUS SEMICONDUCTORS EQUIVALENT TO CRYSTALLINE SEMICONDUCTORS

[75] Inventors: Stanford R. Ovshinsky, Bloomfield Hills; Masatsugu Izu, Birmingham, both of Mich.

[73] Assignee: Energy Conversion Devices, Inc., Troy, Mich.

[21] Appl. No.: 884,664

[22] Filed: Mar. 8, 1978

[51] Int. Cl.² .......................................... H01L 45/00
[52] U.S. Cl. ..................................... 427/39; 148/1.5; 204/192 S; 357/2; 427/74; 427/76; 427/83; 427/84; 427/85; 427/86; 427/53.1; 427/42; 427/248.1
[58] Field of Search ................... 148/1.5; 357/91, 2, 357/13, 20, 63; 427/53, 85, 86, 42, 39, 74, 76, 83, 84, 248 R; 204/192 S

[56] References Cited

U.S. PATENT DOCUMENTS

| | | | |
|---|---|---|---|
| 3,949,119 | 4/1976 | Shewchun et al. | 427/86 |
| 4,047,976 | 9/1977 | Bledsoe et al. | 148/1.5 |
| 4,064,521 | 12/1977 | Carlson | 427/248 A |
| 4,066,527 | 1/1978 | Takagi et al. | 427/86 |
| 4,068,020 | 1/1978 | Reuschel | 357/63 |
| 4,113,514 | 9/1978 | Pankove et al. | 148/1.5 |

OTHER PUBLICATIONS

Brodsky et al., "Doping of Sputtered Amorphous Semiconductors," IBM Tech. Dis. Bulletin, vol. 19, No. 12, May 1977.
Malhotra et al., "Effects of Hydrogen Contamination on the Localized States in Amorphous Silicon," Applied Physics Lett. 28, No. 1, Jan. 1976.
Widmer, "Epitaxial Growth of Si on Si in Ultra High Vacuum," Applied Physics Letters, 5, No. 5, Sep. 1, 1964.
Choo et al., "Hydrogen States in Amorphous Ge," Solid State Communications, 25, pp. 385-387, 1978.

Primary Examiner—John D. Smith
Attorney, Agent, or Firm—Wallenstein, Spangenberg, Hattis & Strampel

[57] ABSTRACT

A method of making an amorphous semiconductor film or the like having desirable photoconductive and/or other properties comprises forming an amorphous semiconductor film, preferably by vaporizing silicon or the like in an evacuated space and condensing the same on a substrate in such space, and preferably at the same time, introducing at least two or three compensating or altering agents into the film, like activated hydrogen and fluorine, in amounts which substantially reduce or eliminate the localized states in the energy gap thereof so that greatly increased diffusion lengths for solar cell applications is obtained and dopants can be effectively added to produce p or n amorphous semiconductor films so that the films function like similar crystalline materials.

47 Claims, 10 Drawing Figures

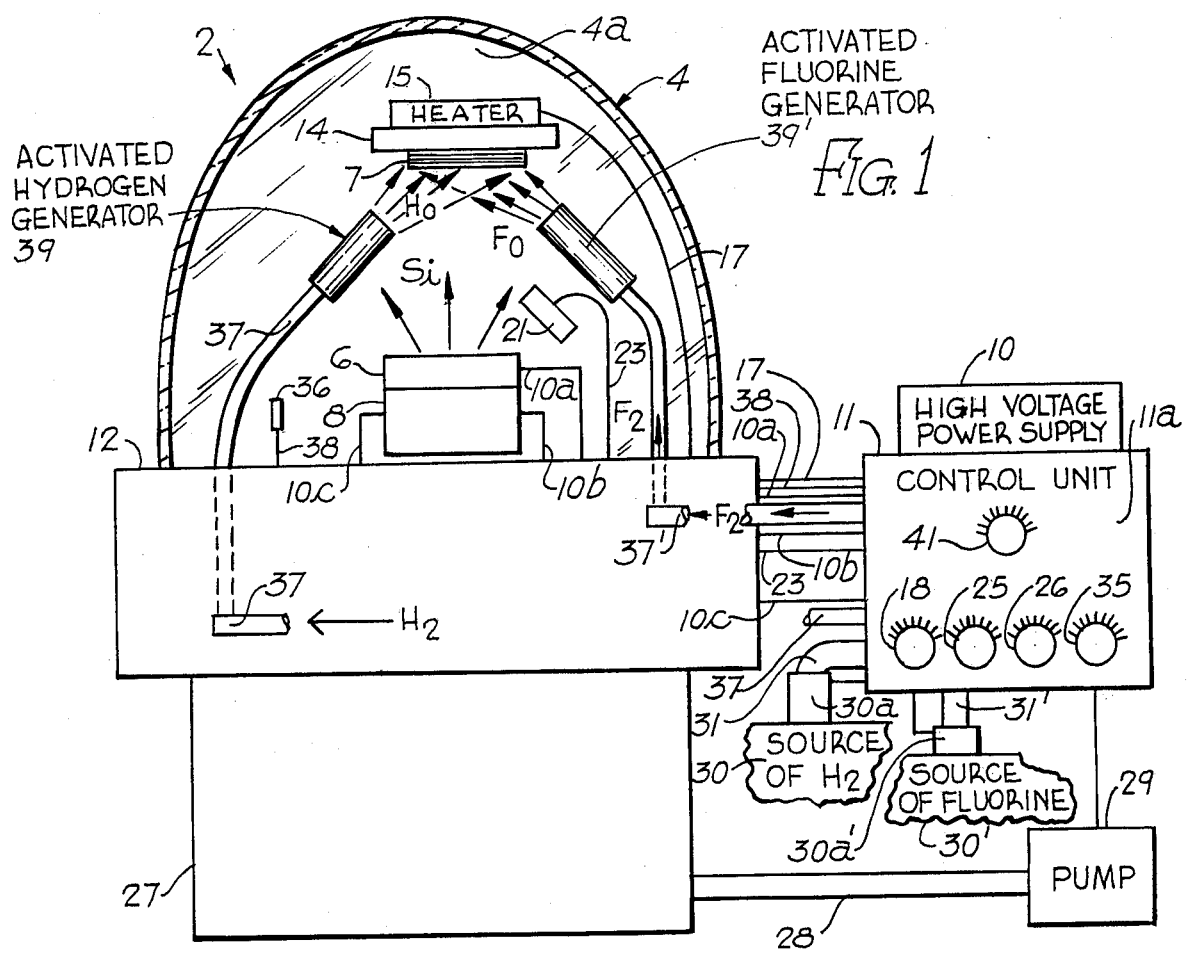
FIG. 1
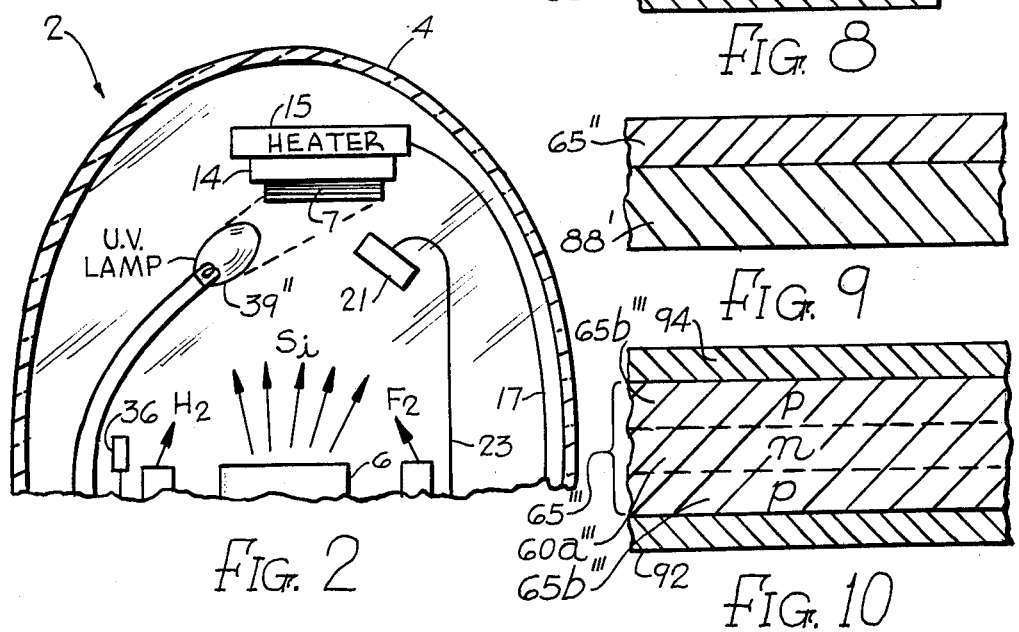
FIG. 2
FIG. 8
FIG. 9
FIG. 10

AMORPHOUS SEMICONDUCTORS EQUIVALENT TO CRYSTALLINE SEMICONDUCTORS

BACKGROUND OF THE INVENTION

The invention relates to methods which permit the reduction or elimination of localized states in the energy gap, such as dangling bonds, recombination centers, etc. in amorphous semiconductor films to provide improved amorphous semiconductor films which have characteristics like those found in corresponding crystalline semiconductors. The amorphous films involved have their most important utility in solar radiation energy-producing devices, and current control devices, such as p-n junction devices including rectifiers, transistors or the like, where heretofore crystalline semiconductor bodies have been used in their fabrication.

The principles involved in the invention can be applied to various types of amorphous semiconductor films, both thick and thin films, which have recombination centers and other localized states inhibiting the control of the conductivity thereof, and are applicable to amorphous semiconductor films made of one or more elements, or combinations of elements which are mixtures or alloys of such elements. Silicon is the basis of the huge crystalline semiconductor industry and is the material which has produced expensive high efficiency (18 percent) crystalline solar cells.

Since amorphous silicon-containing films, if made equivalent to crystalline silicon films, would have many advantages over such crystalline silicon films (e.g. lower cost, larger area, easier and faster manufacture), the main purpose of this invention is to overcome the barrier which has heretofore prevented materials such as amorphous silicon from having characteristics similar to crystalline silicon. Since this invention has overcome what up until now has been an impenetrable barrier to producing useful amorphous silicon films, we therefore initially deal with silicon films, although many aspects of the invention are also applicable to the production of films of various other amorphous semiconductor materials formed by elements including individual elements or mixtures or alloys of elements falling in Groups III through VI of the periodic table.

When crystalline semiconductor technology reached a commercial state, it became the foundation of the present huge semiconductor device manufacturing industry. This was due to the ability of the scientist to grow substantially impurity-free germanium and particularly silicon crystals, and then turn them into extrinsic materials with p and n conductivity regions therein. This was accomplished by diffusing into such pure crystalline materials parts per million of donor or acceptor dopant materials introduced as substitutional impurities into the substantially pure crystalline materials, to increase their electrical conductivity and to control their being either of a p or n conduction type. The fabrication processes for making p-n junction and photoconductive crystals involve extremely complex, time consuming, and expensive procedures. Thus, these crystalline materials useful in solar cells and current control devices are produced under very carefully controlled conditions by growing individual single silicon or germanium crystals, and when p-n junctions are required, by doping such single crystals with extremely small and critical amounts of dopants. These crystal growing processes produce such relatively small crystals that solar cells require the assembly of hundreds of single crystals to encompass the desired area of only a single solar cell panel. The amount of energy necessary to make a solar cell in this process, the limitation caused by the size limitations of the silicon crystal, and the necessity to cut up such a crystalline material has all resulted in an impossible economic barrier to the large scale use of crystalline semiconductor solar cells for energy conversion.

Accordingly, a considerable effort has been made to develop processes for readily depositing amorphous semiconductor films, each of which can encompass relatively large areas, if desired, limited only by the size of the deposition equipment, and which could be readily doped to form p and n junctions where p-n junction devices are to be made therefrom equivalent to those produced by their crystalline counterparts. For many years such work was substantially unproductive. Amorphous silicon or germanium (Group IV) films were found to have microvoids and dangling bonds and other defects which produce a high density of localized states in the energy gap thereof. The presence of a high density of localized states in the energy gap of amorphous silicon semiconductor films results in a low degree of photoconductivity and short diffusion lengths, making such films unsuitable for solar cell applications. Additionally, such films cannot be successfully doped or otherwise modified to shift the Fermi level close to the conduction or valence bands, making them unsuitable for making p-n junctions for solar cell and current control device applications.

In an attempt to minimize the aforementioned problems involved with amorphous silicon and germanium, W. E. Spear and P. G. Le Comber of Carnegie Laboratory of Physics, University of Dundee, in Dundee, Scotland, did some work on "Substitutional Doping of Amorphous Silicon", as reported in a paper published in Solid State Communications, Vol. 17, pp. 1193–1196, 1975, toward the end of reducing the localized states in the energy gap in the amorphous silicon or germanium to make the same approximate more closely intrinsic crystalline silicon or germanium and of substitutionally doping said amorphous materials with suitable classic dopants, as in doping crystalline materials, to make them more extrinsic and of p or n conduction types. This was accomplished by glow discharge deposition of amorphous silicon films wherein a gas of silane ($SiH_4$) and a gas of phosphine ($PH_3$) for n-type conduction, or a gas of diborane ($B_2H_6$) for p-type conduction, were premixed and passed through a reaction tube where the gaseous mixture was decomposed by an r.f. glow discharge and deposited on a substrate at a high substrate temperature of about 500°–600° K. The material so deposited on the substrate is an amorphous material consisting of silicon and hydrogen and substitutional phosphorus or boron in dopant concentrations between about $5 \times 10^{-6}$ and $10^{-2}$ parts per volume. However, the electrical characteristics achieved by doping these materials did not reach the levels which make them commercially acceptable devices, such as solar cell devices, and current control devices including effective p-n junction devices and the like. The major scientific problem remained, i.e., the remaining states in the gap could not be eliminated.

As expressed above, amorphous silicon, and also germanium, is normally four-fold coordinated, and normally has microvoids and dangling bonds, producing localized states in the energy gap. While it is believed that it was not known by these researchers, it is now known that the hydrogen in the silane combines at an optimum temperature with many of the dangling bonds of the silicon during the glow discharge deposition, to decrease substantially the density of the localized states in the energy gap toward the end of making the amorphous material approximate more nearly the corresponding crystalline material. However, the effect of the hydrogen was limited by the fixed ratio of hydrogen and silicon in silane as well as limiting the type of hydrogen bonding and introducing new anti-bonding states all of which can be of importance in these materials. Therefore, as above indicated, the density of the localized states was not reduced sufficiently to render these films commercially useful in solar cell or current control devices.

In addition to the limitations described above, the silane glow discharge deposition of silicon film poses problems which further hinder its commercial suitability. For example, such a process does not lend itself to the mass production of amorphous semiconductor films because it is a slow process, difficult to control and requires silane which is a relatively expensive starting material.

After the development of the glow discharge deposition of silicon from silane gas was carried out, work was done on the sputter depositing of amorphous silicon films in an atmosphere of argon (required by the sputtering deposition process) and molecular hydrogen, to determine the results of such molecular hydrogen on the characteristics of the deposited amorphous silicon film. This research indicated that the molecular hydrogen acted somewhat as a compensating agent to reduce the localized states of the energy gap. However, the degree to which the localized states of the energy gap were reduced in the sputter depositing process was too minimal to be useful for commercial purposes. The degree of reduction in the density of localized states achieved by this sputter deposition process was much less than that achieved by the silane deposition process described above, as would be expected since sputter and vapor deposition processes inherently produce amorphous films with much higher densities of localized states than does a glow discharge deposition process. This is the reason that prior to the present invention, it was not believed that sputter or vapor deposition processes could successfully produce amorphous semiconductor films functionally equivalent to similar crystalline materials used in solar cell and current control devices. Also, the sputtering process must be carried out under certain critical partial pressure limitations, and since such partial pressures are effected both by the amount of argon and hydrogen gas present, the amount of molecular hydrogen gas which could be introduced into the sputtering atmosphere was accordingly limited.

The difficulty encountered heretofore in reducing the density of localized states in the energy gap of amorphous semiconductor materials like silicon and others to desirably low levels, so that these materials are the equivalent of corresponding crystalline materials, is believed to be explainable in the following manner. At or near the Fermi level of these materials deposited, for example, by the glow discharge of silane, are two bumps of relatively high density of states in the energy gap which are apparently related to the remaining dangling bond density. They are located substantially at about 0.4 eV below the conduction band $E_c$ and above the valence band $E_v$. When the glow discharge amorphous silicon is doped with phosphorus or boron, the Fermi level is believed to be moved up or down, but the density of localized states was so high that the dopant could not move the Fermi level close enough to the conduction or valence bands to have an effective p or n junction. Thus, the activation energy for the doped glow discharge amorphous silicon was not lowered below about 0.2 eV. This result also placed a theoretical limitation on the open-circuit photovoltage of a p-n junction of doped glow discharge amorphous silicon, since the internal field cannot exceed the separation of the Fermi level in the p and n type regions. In addition, the remaining activation energy limits the room-temperature DC conduction of the doped glow discharge amorphous silicon and the material would have a large sheet resistance if it were made into a large area array, the resistance not being helped by the rather low carrier mobility which is a factor of about $10^4$–$10^5$ less than that for crystalline silicon. Also, where it is desirable to modify an amorphous silicon film to form an effective ohmic interface, for example, between an intrinsic (undoped) portion thereof and an outer metal electrode, such modified portions of the film must have a very high conductivity. It is apparent that the prior methods of doping such films which produced a conductivity of only $10^{-2}$ (ohm cm)$^{-1}$ would not provide a useful ohmic interface.

As discussed, the prior deposition of amorphous silicon, which has been compensated by hydrogen from the silane in an attempt to make it more closely resemble crystalline silicon and which has been doped in a manner like that of doping crystalline silicon, all done during the glow discharge deposition, has characteristics which in all important respects are inferior to those of doped crystalline silicon and cannot be used successfully in place of doped crystalline silicon.

In contrast, the present invention enables the amorphous silicon and other films to be modified by the addition of conduction-increasing materials so that the conductivity is increased to approximately one (ohm cm)$^{-1}$ or greater, which makes the films useful as ohmic interfaces between other portions of the films and metal electrodes, as well as solving the basic problems of full compensation of multi (various) recombination sites and, therefore, the creation of materials able to form efficient and effective p-n junctions.

DESCRIPTION OF THE INVENTION

The present invention has to do with the formation of an amorphous semiconductor film by depositing on a substrate a solid amorphous semiconductor host matrix wherein, for the first time, the density of localized states in the energy gap of the amorphous semiconductor material is so reduced as to be approximately equivalent to the corresponding crystalline material. This basic feature of this invention breaks the barrier which has prevented amorphous materials from functioning like crystalline materials and represents a significant improvement in the art. As a result, amorphous materials can have the attributes of crystalline materials; they can provide high photoconductivity, long diffusion length, low dark intrinsic electrical conductivity, where desired, and they can be properly modified to shift the Fermi level to provide substantially n or p type extrinsic electrical conductivity, and the like. Thus, amorphous semiconductor materials can act like crystalline materials and be useful in devices, such as solar cells and current controlling devices, including p-n junction devices, diodes, transistors and the like.

Process aspects of the present invention provide amorphous semiconductor films, such as amorphous silicon films and the like, useful in the production of current control devices and solar cells, where the desired characteristics of these films are achieved without the previous referred disadvantages and limitations of the glow discharge silane gas and sputter deposition processes described above. In the process of the most advantageous preferred forms of the present invention, the quantity or quantities of the element or elements which form the basic amorphous semiconductor film and the quantity of the compensating or altering agents believed to reduce the localized states in the energy gap thereof, are independently controllable. Also, the compensating or altering agent is most advantageously produced and injected into the film in a manner where the quantities used are not limited by critical deposition process conditions. Also, they are generated in a form and injected into the amorphous film in a manner where they react most efficiently and effectively with the amorphous film. Additionally, the starting materials used to produce the element or elements which constitute an amorphous silicon film are relatively inexpensive materials, as compared, for example, to gaseous mixtures. Furthermore, in the most important form of the present invention, the process of achieving a more fully compensated or altered amorphous semiconductor film is an easily controllable, reliable, rapid process, suitable for mass production of compensated or altered amorphous semiconductor films. The quality of the amorphous semiconductor film produced is greatly improved. For example, the density of localized states is reduced at least by a factor of 10 or more, and, in some cases, can be substantially eliminated.

In a most important form of the invention, an amorphous silicon-containing film is formed by a vacuum deposition process where the one or more elements which are to form an amorphous silicon-containing film are evaporated by heating the same in an evacuated enclosure, the elements involved then condensing upon a substrate in the enclosure. As previously indicated, vapor deposition of amorphous films has heretofore produced films with extremely high density of localized states, making such films completely useless for the making of solar cell and current control devices. The high densities of localized states was, at least in part, due to the fact that the films were highly porous, resulting in large numbers of dangling bonds in the film and on the exposed surfaces of the film. As will be explained in more detail hereinafter, the conditions for depositing the amorphous film are preferably such as to produce minimum porosity. Alternatively, after the deposition is completed, the film may be separately exposed to conditions which reduce or eliminate the porosity therein. However, since vacuum deposition can inherently put down film many times faster than other methods, it is by far the most economical production technique. Moreover, the vacuum deposition process is inherently a precisely controllable process, suitable for mass production of films generally. As previously indicated, it was not seriously considered useful for making amorphous silicon and other semiconductor films for solar cells and current control devices because such a process was thought to produce films with such high density of localized states in the energy gap that they were unsuitable for these purposes.

While the broader aspects of the invention envision the compensation or alteration of the amorphous semiconductor silicon-containing film or the like with compensating or altering agents in a separate environment from the deposition environment, it is believed that the compensation or alteration of the amorphous silicon film to reduce the localized states thereof can be best achieved by injecting the compensating or altering agents into the amorphous semiconductor film as it deposits on the substrate in the enclosure of the deposition equipment. In either event, the amounts and form of the compensating or altering agent are selected to achieve the best results for the particular film involved.

In accordance with a further feature of the invention, at least two compensating or altering agents, like activated hydrogen and fluorine (e.g. atomic or ionic forms thereof) are preferably generated in the vicinity of the substrate upon which the amorphous semiconductor film is depositing, so that the at least two activated compensating or altering agents reduce the localized states involved in the most efficient and effective manner possible. Such activated hydrogen and/or fluorine, for example, can be produced by passing the molecular gas involved over a heated tungsten filament, or by decomposing the molecular hydrogen or fluorine to produce a hydrogen or fluorine plasma between a pair of electrodes connected to a high DC or radio frequency (RF) voltage. In the most preferred form of the invention, where the compensating or altering agents introduced into the evacuated space in which the vapor deposition process is taking place, compensating or altering agent activating generator units are placed contiguous to the substrate upon which the semiconductor film is being deposited, since the lifetime of these activated materials is generally relatively short. Still another method of producing activated gases is to irradiate the compensating or altering agents, preferably at the location of the depositing amorphous semiconductor film, with radiant energy like ultraviolet light.

If a p-n junction is to be formed, a desired one or more modifying agent, like dopants, can be fed to the depositing film to form one or more n and/or p conductivity regions within the depositing film.

In the previously described silicon deposition processes involving the glow discharge of silane gas and the sputter depositing of amorphous silicon films, it was believed heretofore that only a single compensating agent for reducing the density of localized states in the energy gap was used, namely molecular hydrogen subjected to the fixed deposition processes involved. In accordance with another feature of the present invention, it has been discovered that substantial reductions in the density of localized states, that can also act as recombination centers, is achieved by utilizing two or more compensating or altering agents which compliment one another. For example, it is now believed that fluorine as well as hydrogen act as complimentary compensating or altering agents which reduce the localized states of the energy gap to a degree markedly greater than could be achieved by the utilization of any amount of only one of the same. Thus, it is believed that the activated hydrogen is effective in reducing the localized states in the energy gap at or near the Fermi level, while the activated fluorine further reduces these states as well as other states between those near the Fermi level and the conduction band. The electronegative and the electropositive nature of these elements respectively play a role in affecting differing states in the gap.

In any amorphous semiconductor film the Fermi level cannot be moved almost completely to the valence or conduction band needed to make a good p-n junction unless a very low density of localized states is present. In the attempted doping of the silane glow discharge deposition of silicon films above described with an n-conductivity dopant, the Fermi level was moved to only within 0.2 eV of the conduction band, making the film of no commercial use in solar cells or current control devices. In the present invention, for example, the addition of an n-conductivity dopant, like arsenic, to an amorphous silicon film moves the Fermi level all of the way to the conduction band. The addition of an n-dopant like arsenic to an amorphous silicon film shifts the Fermi level to a point near the conduction band because it is believed that the addition of activated hydrogen reduces the localized states at or near the Fermi level and that the addition of activated fluorine reduces the density of localized states between those at or near the Fermi level and the conduction band. Therefore, a good n-conductivity amorphous silicon film results from such compensation or alteration of the film. To make a good p-conductivity amorphous silicon film, it is necessary substantially to reduce the localized states in the energy gap at or near the Fermi level and between those states and the valence band. A compensating or altering agent other than activated hydrogen and fluorine can be used for the latter purpose. For example, alkaline atoms such as lithium or sodium reduce the density of localized states between those at or near the Fermi level and the valence band, permitting an amorphous silicon film to be successfully doped with conventional p-conductivity dopant materials.

The production of highly efficient solar cells requires long diffusion lengths so that a large number of charge carriers can be separated and collected in response to the reception of photons. This requires a large depletion region in the amorphous semiconductor film involved. The comparable depletion region is obtained in an intrinsic film when there is a low density of localized states producing a low dark conductivity in the amorphous semiconductor film. Such an amorphous semiconductor film is useful in a Schottky barrier solar cell. However, when it is desired to form either a p-n junction solar cell having p-n junctions with the necessary depletion layer, it is necesssary to add dopant conduction modifying agents to move the Fermi level near the valence and conduction bands to form an effective solar cell p and n junctions. In such case, a relatively small amount (about 1% or less) of dopant is added to the film, so that a sufficiently wide depletion region is maintained. As previously indicated, a low density of localized states (with an accompanying low density of recombination centers) enables the amorphous semiconductor film involved to be effectively doped, thusly to form such effective p and n junctions useful in photocells. To increase the photoconductive properties of amorphous semiconductor films further, the low density of localized states makes readily possible also the addition of sensitizing agents like zinc and copper to increase carrier lifetime. If a high dark conductivity is desired, much larger amounts (e.g. 5%) of the conduction modifying agent would generally be added to the portion of the film injected.

The utilization of two or more compensating or altering agents to materially reduce the density of localized states of the energy gap during deposition and subsequent thereto is useful independently of the manner in which the amorphous semiconductor film is deposited, and is thus, for example, also useful where the film is deposited by a sputtering deposition process. However, as above indicated, because vapor deposition offers the most easily controllable and quickest method of amorphous semiconductor film deposition, it is desirable that the two or more compensating or altering agents be added in connection with a vapor deposition process. As previously indicated, while a vacuum deposition process has many advantages as described, it suffers from one disadvantage, namely that is produces generally less dense films than the glow discharge and sputter deposition processes described. Thus, because the vapor deposition process is normally carried out under conditions where the mobility of the depositing atom is somewhat limited, amorphous semiconductor films deposited by this process tend to be relatively porous. A porous film before compensation or alteration will have a relatively higher density of localized states in the energy gap because of the many voids involved resulting in dangling bonds at the interface between the semiconductor film and the adjacent voids. In accordance with another feature of the invention, the degree of porosity of the deposited films is reduced by activating the substrate surface upon which the amorphous semiconductor films are deposited, as by irradiating it with radiant energy like ultra-violet light, heating the substrate to a temperature close to but below the crystallization temperature of the depositing materials, or both. In the case of depositing silicon amorphous films, the temperature of the substrate surface is most advantageously elevated to temperatures in the range of about 200° C. to somewhat below the crystallization temperature thereof (the crystallization temperature of silicon being 680° C.), the higher temperatures generally being preferred because the high surface mobility of the depositing material reduces the microvoids which increase the localized states in the energy gap. Also, it is believed that by utilizing activated forms of the compensating or altering agents, such as atomic or ionic hydrogen and/or fluorine, the injection of such activated compensating or altering agents into the depositing film reduces the porosity of the depositing film. The desirable effect of the injected compensating or altering agents is also improved by directing radiant energy, like ultraviolet light upon the substrate involved.

As previously indicated, while in some respects it is most advantageous to add the compensating or altering and modifying agents to the amorphous semiconductor film during the process of vapor deposition, because of the speed and ease with which these elements can be made to react with the film as it is being formed, in accordance with a broader aspect of the invention, the addition of these agents could be carried out in a separate environment. Thus, after an amorphous semiconductor film has been formed in the evacuated space of vapor deposition equipment, the films so deposited can then be conveniently delivered into a compensating or altering agent-introducing atmosphere different from that in which vapor deposition took place. This is most advantageously one of high temperature and pressure (e.g. 1000 psi) and one where the compensating agents are activated. Thus, the previously produced amorphous semiconductor film is there preferably placed between electrodes connected to a high DC or RF voltage. The film may also be irradiated with ultraviolet light. These conditions effectively result in the diffusion of the compensating or altering agents into the film and in the reduction of the porosity thereof.

In summary, to bring the significance of the present invention into focus, it is believed that the present invention enables the fabrication of amorphous semiconductor films which are like crystalline films for use in the manufacture of solar cells and current control devices including p-n junctions and the like, despite the previously accepted dogma that amorphous semiconductor materials could not be produced in a manner to be equivalent to their crystalline counterparts. Moreover, these films are produced under conditions where the amount and type of bonding of the compensating or altering agents injected or diffused into the films are controlled completely independently of the conditions required for the deposition of the amorphous semiconductor films involved. Additionally, the present invention provides large area, high yield, low cost amorphous semiconductor films. Finally, the films produced so as to provide maximum recombination site compensation, charge carrier separation, and collection for solar cells and, therefore, produce such high energy conversion efficiencies that they should materially contribute to the solution of the energy shortage problems confronting the world to a greater degree each year.

The above-described and other objects, advantages, and features of the invention will become more apparent upon making reference to the specification to follow, the claims and the drawings.

DESCRIPTION OF DRAWINGS

FIG. 1 is a diagrammatic representation of more or less conventional vacuum deposition equipment to which has been added elements for carrying out the unique process of the present invention, namely the addition of molecular hydrogen and fluorine inlets and activated hydrogen and fluorine generating units which heat and decompose the molecular hydrogen and fluorine within the evacuated space of the vapor deposition equipment, to convert molecular hydrogen and fluorine to activated hydrogen and fluorine and to direct the same against the substrate during the deposition of an amorphous silicon film;

FIG. 2 illustrates vacuum deposition equipment like that shown in FIG. 1, with activated hydrogen and fluorine generating means comprising an ultraviolet light source irradiating the substrate during the process of depositing the amorphous silicon film, such light source replacing the activated hydrogen and fluorine generator units shown in FIG. 1;

FIG. 8 is a fragmentary sectional view of a photodetection device which includes an amorphous semiconductor film made by the process of the invention;

FIG. 9 is a fragmentary sectional view of a Xerox drum including an amorphous semiconductor film made by the process of the invention; and FIG. 10 is a p-n-p transistor-like device made from an amorphous semiconductor film made by the process of the invention.

DESCRIPTION OF EXEMPLARY FORMS OF THE INVENTION SHOWN IN DRAWINGS

Figure 3:
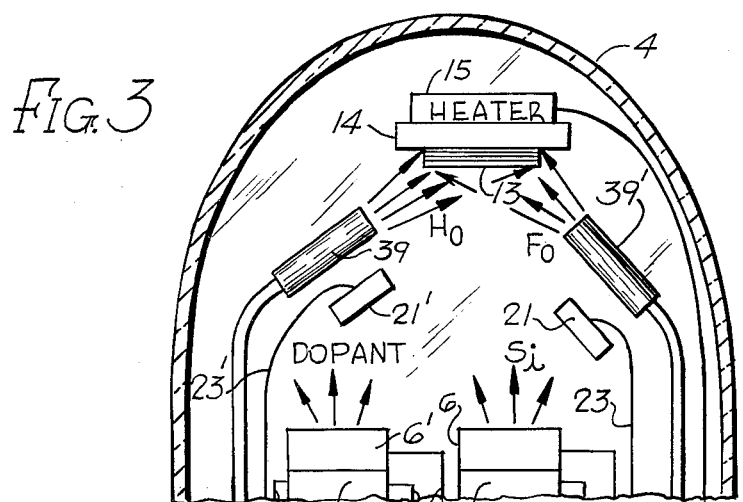
FIG. 3 illustrates the vacuum deposition equipment of FIG. 1 to which has been added additional means for doping the depositing silicon film with a n or p conductivity producing material.

Refer now more particularly to FIG. 1 where is shown vapor deposition equipment generally indicated by reference numeral 2, which may be conventional vapor deposition equipment to which is added activated compensating or altering agent injecting means to be described. This equipment, as illustrated, includes a bell jar 4 enclosing an evacuated space 4a in which is located one or more crucibles like crucible 6 containing the amorphous semiconductor film-producing element or elements to be deposited on a substrate 7. In the best exemplary form of the invention being described, the crucible 6 initially contains ground-up silicon for forming an amorphous silicon film on substrate 7 which, for example, may be a metal, crystalline semiconductor or other material upon which it is desired to form the film to be deposited by the process of the present invention. An electron beam source 8 is provided adjacent to the crucible 6, which electron beam source diagrammatically illustrated usually includes a heated filament and beam deflection means (not shown) which directs a beam of electrons at the silicon contained in the crucible 6 to evaporate the same. A high voltage DC power supply 10 provides a suitable high voltage, for example, 10,000 volts DC, the positive terminal of which is connected through control unit 11 and conductor 10a to the crucible 6 and the negative terminal of which is connected through the control unit 11 and conductor 10b to the filament of the electron beam source 8. The control unit 11 including relays or the like for interrupting the connection of the power supply 10 to the conductors 10a-10b when the film thickness of a film deposition sampling unit 21 in the evacuated space 4a reaches a given value set by operating a manual control 25 on a control panel 11a of the control unit 11. The film sampling unit 21 has a cable 23 which extends to the control unit 11 which includes well known means for responding to both the thickness of the film deposited upon the film sampling unit 21 and the rate of deposition thereof. A manual control 26 on the control panel 11a may be provided to fix the desired rate of deposition of the film controlled by the amount of current fed to the filament of the electron beam source through conductor 10c in a well known manner.

The substrate 7 is carried on a substrate holder 14 upon which a heater 15 is mounted. A cable 17 feeds energizing current to heater means 15 which controls the temperature of the substrate holder 14 and substrate 7 in accordance with a temperature setting set on a manual control 18 on the control panel 11a of the control unit 11.

The bell jar 4 is shown extending upwardly from a support base 12 from which the various cables and other connections to the components within the bell jar 4 may extend. The support base 12 is mounted on an enclosure 27 to which connects a conduit 28 connecting to a vacuum pump 29. The vacuum pump 29, which may be continuously operated, evacuates the space 4a within the bell jar 4. The desired pressure for the bell jar is set by a control knob 35 on the control panel 11a. In the most preferred form of the invention, this setting controls the pressure level at which the flow of activated hydrogen and fluorine into the bell jar 4 is regulated Thus, if the control knob is set to a bell jar pressure of $10^{-4}$ tor., the flow of hydrogen and fluorine into the bell jar 4a will be such as to maintain such pressure in the bell jar as the vacuum pump 29 continues to operate.

Sources 30 and 30' of molecular hydrogen and fluorine are shown connected through respective conduits 31 and 31' to the control unit 11. A pressure sensor 36 in the bell jar 4 is connected by a cable 38 to the control unit 11. Flow valves 30a and 30a' are controlled by the control unit 11 to maintain the set pressure in the bell jar. Conduits 37 and 37' extend from the control unit 11 and pass through the support base 12 into the evacuated space 4a of the bell jar 4. Conduits 37 and 37' respectively connect with activated hydrogen and fluorine generating units 39 and 39' which convert the molecular hydrogen and fluorine respectively to activated hydrogen and fluorine, which may be atomic and/or ionized forms of these gases. The activated hydrogen and fluorine generating units 39 and 39' may be heated tungsten filaments which elevate the molecular gases to their decomposition temperatures or a plasma generating unit well known in the art for providing a plasma of decomposed gases. Also, activated hydrogen and fluorine in ionized forms formed by plasma can be accelerated and injected to the depositing film by applying an electric field between the substrate and the activating source. In either event, the activated hydrogen and fluorine generator units 39 and 39' are preferably placed in the immediate vicinity of the substrate 7, so that the relatively short-lived activated hydrogen and fluorine delivered thereby are immediately injected into the vicinity of the substrate 7 where the silicon film is depositing.

As previously indicated, to produce useful amorphous silicon films which have the desired characteristics for use in solar cells, p-n junction current control devices, etc., the compensating or altering agents produce a very low density of localized states in the energy gap without changing the basic intrinsic character of this film. This result is achieved with relatively small amounts of activated hydrogen and fluorine so that the pressure in the evacuated bell jar space 4a can still be a relatively low pressure (like $10^{-4}$ tor.). The pressure of the gas in the generator can be higher than the pressure in the bell jar by adjusting the size of the outlet of the generator.

The temperature of the substrate 7 is adjusted to obtain the maximum reduction in the density of the localized states in the energy gap of the amorphous semiconductor film involved. The substrate surface temperature will generally be such that it ensures high mobility of the depositing materials, and preferably one below the crystallization temperature of the depositing film.

The surface of the substrate can be irradiated by radiant energy to further increase the mobility of the depositing material, as by mounting an ultraviolet light source (not shown) in the bell jar space 4a. Alternatively, instead of the activated hydrogen and fluorine generator units 39 and 39' in FIG. 1, these units can be replaced by an ultraviolet light source 39" shown in FIG. 2, which directs ultraviolet energy against the substrate 7. This ultraviolet light will decompose the molecular hydrogen and fluorine both spaced from and at the substrate 7 to form activated hydrogen and fluorine which diffuse into the depositing amorphous semiconductor film condensing on the substrate 7. The ultraviolet light also enhances the surface mobility of the depositing material.

The vapor deposition equipment illustrated can include means for adding modifying agents, like a sensitizing material which enhances photoconductivity. As examples of such photoconductive-increasing sensitizing materials are zinc, gold, copper, silver, manganese, or the like. As previously indicated, other modifying agents can also be added which create new states in the energy gap of the film, such as dopants which impart a substantial p or n conductivity to the film desirable for p-n junction devices.

Refer now to FIG. 3 which illustrats additions to the equipment shown in FIG. 1 for adding modifiers to the depositing film. For example, a n-conductivity dopant, like phosphorus or arsenic, may be initially added to make the intrinsically modest n-type silicon film a more substantially n-type film, and then a p-dopant like aluminum, gallium or indium may be added to form a good p-n junction within the film. A crucible 6' is shown for receiving a dopant like arsenic which is evaporated by bombarding the same with an electron beam source 8', like the beam source 8 previously described. The rate at which the dopant evaporates into the atmosphere of the bell jar 4, which is determined by the intensity of the electron beam produced by the electron beam source 8', is set by a manual control 41 on the control panel 11a, which controls the current fed to the filament forming part of this beam source to produce the set evaporation rate. The evaporation rate is measured by a film thickness sampling unit 21' upon which the dopant material deposits and which generates a signal on a cable 23' extending between the unit 21' and control unit 11, which indicates the rate at which the dopant material is deposited on the unit 21'.

After the desired thickness of amorphous silicon film having the desired degree of n-conductivity has been deposited, evaporation of silicon and the n-conductivity dopant is terminated and the crucible 6' (or another crucible not shown) is provided with a p-conductivity dopant described, and the amorphous film and dopant deposition process then proceeds as before to increase the thickness of the amorphous semiconductor film with a p-conductivity region therein.

While the principles of this invention have its most important utility in amorphous silicon and silicon alloy films, it also has utility in solid amorphous semiconductor matrices, including other Group IV elements having normal tetrahedral bonding and three-dimensional stability, Group V elements like arsenic having normal trivalent bonding and two-dimensional stability (i.e., sheets), Group VI elements like tellurium, selenium and sulphur and boron in Group III. Generally speaking, the Group V and VI amorphous materials do not contain microvoids and dangling bonds as do the Group IV amorphous materials and the Group IV amorphous materials do not contain lone pairs as do the Group V and VI amorphous materials. The presence of elements from Groups III or V in the semiconductors containing Group VI elements crosslink the chains thereof, and the presence of elements from Group IV in the semiconductors containing Group V or VI elements crosslink either the sheets of Group V or the chains and rings of Group VI, so that three-dimensional stability can be accomplished in the amorphous semiconductors containing the Group V and VI elements. The amorphous semiconductor host matrix involved in this invention can include mixtures or alloys of the aforementioned elements and materials, to tailor-make the energy gap for desired physical, thermal and optical purposes, while being capable of being independently compensated and modified to tailor-make the electronic configurations for desired electronic purposes. For example, alloying of two or more elements can increase the high temperature stability of the film involved (e.g. silicon and carbon). Generally, combinations of elements from Group III and/or Group IV form high temperature amorphous semiconductor materials which can be compensated and modified as described, to produce solar cells and current control devices at temperatures up to 500° C. and above.

In the manufacture of photoconductive films, in addition to silicon-containing films, amorphous semiconductor films useful in solar cells can be deposited by the vaporizing equipment described and desirably may include, for example, amorphous films of arsenic or selenium, alloys of cadmium and sulphur, alloys of gallium and arsenic, alloys of arsenic and selenium, and alloys of arsenic and tellurium.

In the case where the amorphous semiconductor films comprise two or more elements which are solid at room temperature, then it is usually desirable to separately vaporize each element placed in a separate crucible, and control the deposition rate thereof in any suitable manner, as by setting controls on the control panel 11 which, in association with the deposition rate and thickness sampling units, controls the thickness and composition of the depositing film.

While activated hydrogen and fluorine are believed to be the most advantageous compensating agents for use in compensating amorphous semiconductor films like silicon, in accordance with broader aspects of the invention, other compensating agents can be used. For example, alkali metals, particularly lithium and sodium; rare earth metals; transition metals like vanadium, copper and zinc; carbon and chlorine are useful in reducing the density of localized states in the energy gap when used in such small amounts as not to change the intrinsic characteristics of the film.

Figure 4:
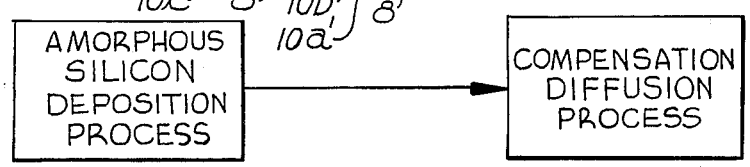
FIG. 4 illustrates an application of the present invention wherein the deposition of the amorphous silicon film and the application of the activated hydrogen and fluorine are carried out as separate steps and in separate enclosures.
Figure 5:
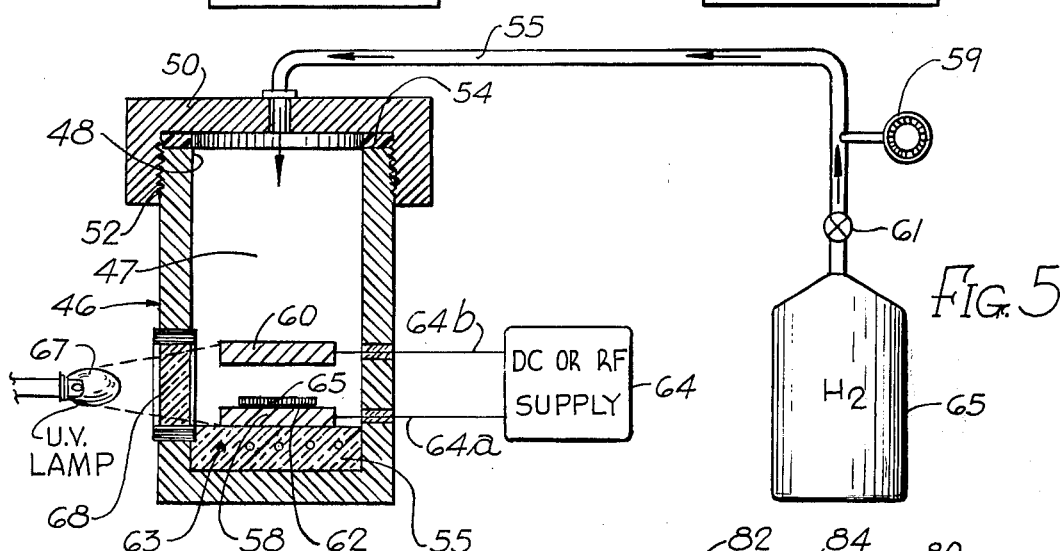
FIG. 5 illustrates exemplary apparatus for diffusing activated hydrogen into a previously deposited amorphous silicon film.

As previously indicated, although it is preferred that compensating or altering and modifying agents be incorporated into the amorphous semiconductor film involved as it is deposited, in accordance with another aspect of the invention, the amorphous film deposition process and the process of injecting compensating or altering and modifying agents into the semiconductor films can be done in a completely separate environment from the depositing of the amorphous film. This can have an advantage in certain applications since the conditions for injecting such agents are then completely independent of the conditions for film deposition. Also, as previously explained, if the vapor deposition process produces a porous film, the porosity of the film, in some cases, is more easily reduced by environmental conditions quite different from that present in the vapor deposition process. To this end, reference should now be made to FIGS. 4 and 5 which illustrate that the amorphous deposition process and the compensating or altering agent diffusion process are carried out as separate steps in completely different environments, FIG. 5 illustrating apparatus for carrying out the compensation diffusion process. As there shown, a high pressure container body 46 is provided which has a high pressure chamber 47 having an opening 48 at the top thereof. This opening 48 is closed by a cap 50 having threads 52 which thread around a corresponding threaded portion on the exterior of the container body 46. A sealing O-ring 54 is sandwiched between the cap 50 and the upper face of the container body. A sample-holding electrode 58 is mounted on an insulating bottom wall 55 of the chamber 47. A substrate 62 upon which an amorphous semiconductor film 65 has already been deposited is placed on the electrode 58. The upper face of the substrate 62 contains the amorphous semiconductor film 65 to be compensated in the manner now to be described.

Spaced above the substrate 62 is an electrode 60. The electrodes 58 and 60 are connected by cables 64a and 64b to a DC or RF supply source 64 which supplies a voltage between the electrodes 58 and 60 to provide an activated plasma of the compensating or altering gas or gases, such as, hydrogen, fluorine and the like, fed into the chamber 47. For purposes of simplicity, FIG. 5 illustrates only molecular hydrogen being fed into the chamber 47 by an inlet conduit 55 passing through the cap 50 and extending from a tank 65 of molecular hydrogen held at a very high pressure, like 1,000 psi. Other compensating or altering gases, such as, fluorine and the like are similarly fed into the chamber 47. This high pressure is thus also present in the chamber 47. The conduit 55 is shown connected to a valve 61 near the tank 65. A pressure indicating guage 59 is shown connected to the inlet conduit 55 beyond the valve 61.

Suitable means are provided for heating the interior of the chamber 47 so that the substrate temperature is elevated preferably to a temperature below but near the crystallization temperature of the film 65. For example, coils of heating wire 63 are shown in the bottom wall 55 of the chamber 47, to which coils connect a cable (not shown) passing through the walls of the container body 46 to a source of current for heating the same.

The combination of high temperature and pressure condition together with a plasma of hydrogen developed between the electrode 58 and 60 achieve a number of desirable results. First of all, the molecular hydrogen fed into the chamber 47 is activated between the electrodes 58 and 60. The activated hydrogen so produced under the high temperature and high pressure conditions described will readily diffuse into the thin amorphous semiconductor film (which, for example, may be of the order of 1 micron thick). The high pressure and high temperature conditions plus the diffusion of activated hydrogen into the semiconductor film 65 reduces or eliminates the porous structure of the film. Any molecular hydrogen which initially diffuses into the amorphous semiconductor film 65 will be activated also by the electric field in which the film 65 is located. The compensating and pore-reducing effect of the hydrogen in the amorphous semiconductor film 65 can be further enhanced by irradiating the amorphous semiconductor film 65 with radiant energy from an ultraviolet light source 67, which is shown outside of the container body 46 directing ultraviolet light between the electrodes 58 and 60 through a quartz window 68 mounted in the side wall of the container body 46.

As previously indicated, the present invention provides photoconductive and readily modifiable amorphous semiconductor films where the localized states of the energy gap are of much lower than heretofore achieved and with greatly improved photoconductivity and low internal resistance or large internal resistance, as desired.

Figure 6:
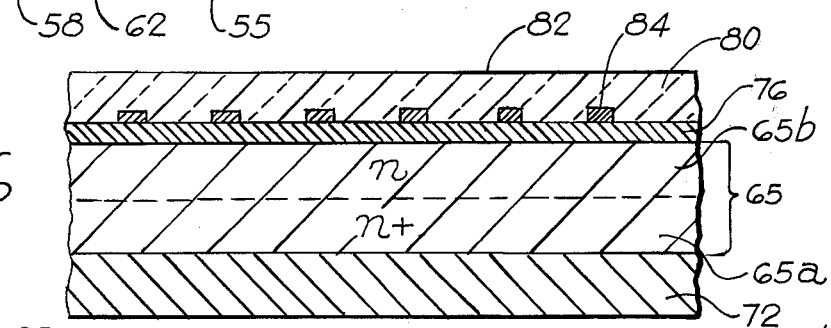
FIG. 6 is a fragmentary sectional view of one embodiment of a solar cell to illustrate one application of the amorphous semiconductor photoconductive films made by the process of the invention.
Figure 7:
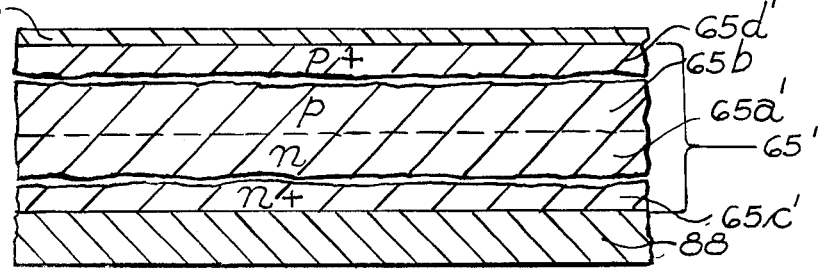
FIG. 7 is a fragmentary sectional view of a p-n junction solar cell device which includes a doped amorphous semiconductor film made by the process of the invention.

Various applications of the improved amorphous semiconductor films produced by the unique processes of the invention are illustrated in FIGS. 6 through 10. FIG. 6 shows a Schottky barrier solar cell in fragmentary cross-section. The solar cell illustrated includes a substrate 72 of a material having both good electrical conductivity properties under dark as well as light conditions, and the ability of making an ohmic contact with an amorphous silicon film 65 compensated or altered to provide a low density of localized states in the energy gap as produced by the processes of the present invention. The substrate 72 may comprise a low work function metal, such as aluminum, tantalum, stainless steel or other material matching with the amorphous semiconductor film 65 deposited thereon which is preferably silicon, compensated or altered in the manner of the silicon films previously described so that it has a low density of localized states in the energy gap of no more than $10^{16}$ per cubic centimeter per eV and preferably less. It is most preferred that the film have a region 65a next to the electrode 72, which region forms a n-plus conductivity, heavily doped, low resistance interface between the electrode 72 and an undoped relatively high dark resistance region 65b which has an intrinsic low n-conductivity.

The upper surface of the amorphous semiconductor film 65 as viewed in FIG. 6 joins a metallic region 76, the interface between this metallic region 76 and the amorphous semiconductor film 65 forming a Schottky barrier. The metallic region 76 is transparent or semi-transparent to solar radiation, has good electrical conductivity and is of a high work function (for example, 4.5 eV or greater, produced, for example, by gold, platinum, palladium, etc.) relative to that of the amorphous semiconductor film 65, which is assumed to be silicon in the exemplary form of the invention now being described. The metallic region 76 may be a single layer of a metal or it may be multi-layered. The amorphous semiconductor film 65 may have a thickness of about 1 micron, the metallic region 76 may have a thickness of about 100 Å in order to be semi-transparent to solar radiation.

On the surface of the metallic region 76 is deposited a grid electrode 84 made of a metal having good electrical conductivity. The grid may comprise orthogonally related lines of conductive material occupying only a minor portion of the area of the metallic region, the rest of which is to be exposed to solar energy. For example, the grid 84 may occupy only about from 5 to 10% of the entire area of the metallic region 76. The grid electrode 84 uniformly collects current from the metallic region 76 to assure a good low series resistance for the device.

An anti-reflection layer 80 may be applied over the grid electrode 84 and the areas of the metallic region 76 between the grid electrode areas. The anti-reflection layer 80 has a solar radiation incident surface 82 upon which impinges the solar radiation. For example, the anti-reflection layer 80 may have a thickness in the order of magnitude of the wavelength of the maximum energy point of the solar radiation spectrum, divided by 4 times the index of refraction of the anti-reflection layer 80. If the metallic region 76 is platinum of 100 A thickness, a suitable anti-reflection layer 80 would be zirconium oxide of about 500 A in thickness and an index of refraction of 2.1.

At the interface between the metallic region 76 and the amorphous semiconductor film 65, a Schottky barrier is formed which enables the photons from the solar radiation to produce current carriers in the film 65, which are collected as current by the grid electrode 84.

In addition to the Schottky barrier solar cell shown in FIG. 6, there are solar cell constructions which utilize p-n junctions in the body of the amorphous semiconductor film forming a part thereof formed in accordance with successive deposition, compensating or altering and doping steps like that previously described. These other forms of solar cells are generically illustrated in FIG. 7. These constructions generally include a transparent electrode 85 through which the solar radiation energy penetrates into the body of the solar cell involved. Between this transparent electrode and an opposite electrode 88 is a deposited amorphous semiconductor film 65', preferably silicon, initially compensated or altered in the manner previously described. In this amorphous semiconductor film 65' are at least two adjacent regions 65a' and 65b' where the amorphous semiconductor film has respectively oppositely doped regions, region 65a' being shown as a n-conductivity region and region 65b' being shown as a p-conductivity region. The doping of the regions 65a' and 65b' is only sufficient to move the Fermi levels to the valence and conduction bands involved so that the dark conductivity remains at a low value achieved by the compensation or alteration method of the invention. The film 65' has a high conductivity, highly doped ohmic contact interface regions 65c' and 65d' of the same conductivity type as the adjacent region of the film 65'. The film regions 65c' and 65d' contact electrodes 88 and 85, respectively.

Refer now to FIG. 8 illustrating another application of an amorphouus semiconductor film utilized in a photo-detector device whose resistance varies with the amount of light impinging thereon. The amorphous semiconductor film 65 thereof is compensated or altered in accordance with the invention, has no p-n junctions as in the embodiment shown in FIG. 7 and is located between a transparent electrode 86' and a substrate electrode 88'. In a photo-detector device it is desirable to have a minimum dark conductivity and so the amorphous semiconductor film 65 has an undoped and compensated region 65b and heavily doped regions 65a and 65c of the same conductivity type forming a low resistance ohmic contact with the electrodes 88' and 86', which may form a substrate for the film 65.

Refer now to FIG. 9 which shows an electrostatic image-producing device (like the drum of a Xerox machine) where it is desirable to have a low dark conductivity in an undoped amorphous semiconductor film 65'' thereof which is compensated or altered in accordance with the present invention. The electrostatic image-producing device is deposited on a substrate 88'.

Reference should now be made to FIG. 10 which shows a p-n-p current control device having outer electrodes 92 and 94 on the opposite faces of a film 65''' of an amorphous semiconductor material like silicon compensated or altered in accordance with the invention. The amorphous semiconductor film 65'' has outermost p-doped regions 65b''' and 65b'' and a preferably doped base-forming intermediate region 65a''' of n-conductivity type. If the device is to form a transistor, a terminal connection is made to the base-forming region 65a" of the film.

In summary, the process aspects of the present invention make possible the practical utilization of amorphous semiconductor films in the making of a variety of devices which can be made solely of deposited amorphous semiconductor and metal films, heretofore not believed possible because of the assumed difficulty of lowering the density of localized states of amorphous semiconductor films to values where sufficiently long diffusion lengths and good doping and other film modification capabilities are achieved.

As used herein the terms compensating agents and altering agents or materials mean materials which are incorporated in the amorphous semiconductor host matrix material for altering or changing the structure thereof, such as, activated hydrogen or fluorine incorporated in amorphous silicon to form an amorphous silicon/hydrogen/fluorine composition film having a desired energy gap and a low density of localized states therein.

It is understood that numerous modifications may be made in the various preferred forms of the invention described, without deviating from the broader aspects thereof. For example, the feature of utilizing compensating or altering agents which are formed and activated in amounts independently of the film deposition process, while having its most advantageous use in connection with a vacuum deposition process also has application in depositing or deposited films formed by the sputter deposition process.

We claim:

1. A method of producing an amorphous semiconductor fluid comprising a solid compensated or altered amorphous semiconductor host matrix with electronic configurations which have an energy gap and a low density of localized states therein, said method comprising depositing on a substrate an amorphous semiconductor host matrix film and introducing therein a plurality of different and complimentary compensating or altering materials comprising at least hydrogen and fluorine, each of which reduces localized states in the energy gap not similarly reducible by any amounts used of the other of same, so that the combination of said different and compensating or altering materials produces a greater reduction in the density of localized states in the energy gap than any one of the same could achieve.

2. The method of claim 1 wherein some of the localized states in the energy gap of said amorphous semiconductor host matrix in its uncompensated state are concentrated at or near the Fermi level thereof and others are located at points between these localized states and relatively close to the valence and conduction bands, and said different and compensating or altering materials introduced into said film are selected so that at least one reduces said localized states at or near the Fermi level and another reduces said localized states between those at or near said Fermi level and one of said bands.

3. The method of claim 2 wherein there is at least a third compensating or altering material introduced into the film which reduces said localized states between those at or near the Fermi level and the other of said bands.

4. The method of claim 1, 2, or 3 wherein said amorphous semiconductor film is modified by adding a dopant material which shifts the Fermi level thereof to a point at or near the valence or conduction band thereof.

5. A method of making an amorphous semiconductor film to comprise an amorphous host matrix having at least one element and which has electronic configurations which have an energy gap with a density of localized states which adversely affect the obtainment of a given electrical characteristic unless compensated or altered by a compensating or altering material, said method comprising: depositing on a substrate an amorphous semiconductor host matrix film and introducing therein a plurality of different compensating or altering materials comprising at least fluorine and which, as they are introduced into said host matrix material, are in an activated form produced in a manner where the amount produced and the form thereof is independent of the process of depositing the film.

6. The method of claim 5 wherein said at least one element of said host matrix is silicon.

7. The method of claim 5 wherein at least two complimentary compensating or altering materials are introduced into said film, each of which reduces localized states in the energy gap thereof not similarly reduced by the other of same.

8. The method of claim 5 wherein said at least one element of said hot matrix material is silicon and said plurality of compensating of altering materials is hydrogen and fluorine.

9. The method of claim 5 wherein said activated compensating or altering materials are introduced into the film as the film is being deposited.

10. The method of claim 5 wherein said plurality of compensating or altering materials are gaseous or vaporized materials activated by elevating their temperatures to a high gas decomposing temperature.

11. The method of claim 5 wherein said plurality of compensating or altering materials are activated by radiant energy.

12. The method of claim 7 wherein said compensating or altering materials comprise at least hydrogen and fluorine.

13. The method of claim 5, 6, 7, or 9 where said plurality of compensating or altering materials is activated into a state which is relatively unstable and such compensating materials are activated in the immediate vicinity of the amorphous semiconductor film into which they are then introduced.

14. The method of claim 9 wherein the amorphous semiconductor film is formed in an evacuated space, and said compensating or altering materials are activated in said evacuated space in the immediate vicinity of the depositing amorphous semiconductor film into which they are then introduced.

15. The method of claim 5 wherein said activated compensating or altering materials are activated by an electric field generated between two spaced electrodes to form a plasma of such compensating or altering materials.

16. The method of claim 15 wherein the film of amorphous semiconductor material into which the compensating or altering materials are introduced is located between said electrodes.

17. The method of claim 1 or 5 wherein the amorphous semiconductor film is deposited in a first environment and the compensating or altering materials are injected into said film in a different environment.

18. The method of claim 17 wherein said first environment includes an evacuated space and the second environment is an environment where the pressure is greater than atmospheric pressure.

19. The method of claim 18 wherein the amorphous semiconductor film in said second environment is heated to a temperature below the crystallization temperature thereof.

20. The method of claim 1 or 5 wherein the amorphous semiconductor film is heated to a temperature below the crystallization temperature thereof as the compensating or altering materials are introduced into the same.

21. A method of making a semiconductor film having good photoconductive properties, the film comprising an amorphous photoconductive semiconductor host matrix having structural configurations which would have a high density of localized states which adversely affects the obtainment of a high degree of photoconductivity unless compensated or altered by a compensating or altering material, said method comprising: vaporizing the element or elements which are to form said semiconductor host matrix in an evacuated space, condensing the same on a substrate in said evacuated space while introducing into the depositing film a plurality of compensating or altering materials comprising at least fluorine and which substantially reduces the density of said localized states and the dark conductivity thereof from that which would be provided without introducing said plurality of compensating or altering materials.

22. A method of making a semiconductor film having a given desirable electrical characteristic and to comprise an amorphous semiconductor host matrix and which would have structural configurations having a high density of localized states in the energy gap thereof adversely affecting the obtainment of said electrical characteristic unless compensated or altered by a compensating or altering material, said method comprising:
vaporizing the element of elements which are to form said semiconductor host matrix in an evacuated space, and condensing the same on a substrate in said evacuated space while introducing into the depositing film a plurality of compensating or altering materials comprising at least fluorine and in an amount which substantially reduces the density of said localized states from that which would be provided without introducing said plurality of compensating or altering materials.

23. A method of making an amorphous semiconductor film to comprise an amorphous host matrix having at least one element including silicon and which has electronic configurations which have an energy gap with a density of localized states which adversely affect the obtainment of a given electrical characteristic unless compensated or altered by a compensating or altering material, said method comprising:
introducing into such amorphous semiconductor host matrix at least one compensating material including fluorine which, as it is introduced into said host matrix material, is in activated form.

24. The method of claim 23 wherein said film is modified by adding relatively small amounts of a dopant material which shifts the Fermi level thereof to a point at or near the valence or conduction band thereof.

25. The method of claim 23 wherein said activated compensating or altering material is introduced into the film as the film is being formed.

26. The method of claim 25 wherein the amorphous semiconductor film is formed in an evacuated space, and said compensating material or altering is activated in said evacuated space in the immediate vicinity of the depositing amorphous semiconductor film into which it is then introduced.

27. The method of claim 1, 5, 21, 22 or 23 used to fabricate the charge carrier supplying portion of a solar cell and wherein there is also introduced into the compensated or altered amorphous semiconductor host matrix film conduction modifying materials in relatively small but sufficient amounts so that the Fermi level of adjacent regions thereof are moved respectively at or near the valence and conduction bands but without appreciably increasing the dark conductivity thereof, to form therein a p-n junction with an effective depletion layer.

28. The method of claim 1, 5, 21, 22 or 23 used to fabricate the charge carrier supplying portion of a solar cell and wherein there is also introduced into the compensated or altered amorphous semiconductor host matrix film conduction modifying materials in relatively small but sufficient amounts so that the Fermi level of adjacent regions thereof are moved respectively at or near the valence or conduction band but without appreciably increasing the dark conductivity thereof, to form therein a p-n junction with an effective depletion layer, and there is further formed in a compensated or altered portion of the film an ohmic contact interface forming a region between said p-n junction and an electrode of the cell by introducing into the latter region of the film relatively large amounts of a conduction modifying material so that the dark conductivity thereof is increased so that this region has a low resistance.

29. The method of claim 1, 5, 21, 22 or 23 wherein during the depositing of said film, said compensating or altering material and one or more dopants and introduced into the depositing film in amounts to move the Fermi level of the film first at or near one of the valence or conduction bands and then to the other of same to form at least one p-n junction in the film.

30. The method of claim 1, 5, 21, 22 or 23 carried out in the process of making a Schottky barrier solar cell, the charge carrier supplying portion of which is supplied by at least a portion of said compensated or altered film.

31. The method of claim 1, 5, 21 22 or 23 carried out in the process of making a Schottky barrier solar cell, the charge carrier supplying portion of which is supplied by at least a portion of said compensated or altered film, and there is formed in a second portion of said compensated or altered film an ohmic contact interface between said first portion of the film and an electrode of the cell by introducing into the latter region of the film relatively large amounts of a conduction modifying material so that the dark conductivity thereof is increased so that this region has a low resistance.

32. The method of claim 1, 5, 21, 22 or 23 carried out in the process of making an electrostatic image-producing device, the charge holding portion of which is supplied by said compensated or altered film.

33. A method of making a p-n junction-containing amorphous semiconductor host matrix body having structural configurations which would have configurations having an energy gap with a high density or localized states therein unless compensated or altered by a compensating or altering material, said method comprising the steps of vaporizing in an evacuated space the element or elements which are to form said semiconductor body, condensing the same as a film upon a substrate, introducing into the depositing film a plurality of compensating or altering materials comprising at least fluorine and which will cause the film to have a relatively low density of localized states in the energy gap thereof, and during only part of the period said film is being deposited injecting a modifying agent which will impart thereto either a p or n-type conductivity to form a p-n junction in the film.

34. A method of making an amorphous semiconductor host matrix body having structural configurations which would have configurations having an energy gap with a high density of localized states therein unless compensated or altered by a compensating or altering material, said method comprising the steps of vaporizing in an evacuated space the element or elements which are to form said semiconductor body, condensing the same as a film upon a substrate, and introducing into the film a plurality of different compensating or altering materials which will cause the film to have a relatively low density of localized states in the energy gap thereof, while elevating the temperature of the film to a point below the crystallization temperature thereof to reduce the porosity of the film and the localized states in the energy gap.

35. The method of claim 34 wherein the environment in which said compensating or altering materials are introduced into said amorphous semiconductor host matrix film is different from that wherein said film was deposited and which is in excess of atmospheric pressure.

36. The method of claim 34 or 35 where said compensating or altering materials introduced into the film are activated by an electric field.

37. The method of claim 34 wherein said compensating or altering materials introduced into the film are activated by radiant energy.

38. The method of claim 34, 35, or 37 wherein said film and compensating or altering materials are subjected to an electric field.

39. The method of claims 1, 5, 21, 22, 29 or 23 wherein the density of localized states in the energy gap of the film is reduced substantially to at least $10^{16}$ per cubic centimeter per eV.

40. The method of claim 24 or 27 wherein the density of localized states in the energy gap of said amorphous semiconductor film is no greater than $10^{16}$ per cubic centimeter per eV and the conductivity of said ohmic contact interface region thereof is no less than about $10^{-1}$ (ohm cm)$^{-1}$.

41. The method of claim 1, 5, 21, 22 or 23 carried out in the process of making a solar cell and wherein there is introduced into said amorphous semiconductor host matrix film at least one modifying material which increases the carrier lifetime within the film.

42. The method of claim 5, 21, 22, 33 or 34 wherein at least two different compensating or altering materials are introduced into the amorphous semiconductor film which materials include hydrogen and fluorine.

43. The method of claim 1, 5, 21, 22, 33 or 34 wherein at least three compensating or altering materials are introduced into said film which include hydrogen, flourine and lithium or sodium.

44. The method of claim 1, 5, 21, 22, 33 or 34 wherein the compensating or altering materials include a rare earth metal, a transition metal, carbon or chlorine.

45. The method of claim 1, 5, 21, 22, 33 or 34 wherein said amorphous semiconductor host matrix includes silicon or alloys or mixtures of silicon and other elements forming therewith a semiconductor material.

46. The method of claim 1, 5, 21, 22, 33 or 34 where said amorphous semiconductor host matrix is a photoconductive material including selenium, cadmium, tellerium, gallium, or arsenic, or alloys or mixtures thereof.

47. The method of claim 1, 5, 21, 22, 33 or 34 wherein said amorphous semiconductor host matrix includes germanium, carbon arsenic, cadmium, tellurium, gallium, selenium, sulphur, or boron, or alloys or mixtures thereof.

* * * * *

UNITED STATES PATENT AND TRADEMARK OFFICE
CERTIFICATE OF CORRECTION

PATENT NO. : 4,217,374
DATED : August 12, 1980
INVENTOR(S) : Stanford R. Ovshinsky, Bloomfield Hills;
Masatsugu Izu, Birmingham, both of Michigan It is certified that error appears in the above—identified patent and that said Letters Patent is hereby corrected as shown below:

Column 7, line 8, "0.2" should be --.2--;
Column 8, line 11, "is" should be --it--;

Column 13, line 47, "characteristics" should be --characteristic--;
Claim 1, line 2, "fluid" should be --film--;
Claim 5, line 2, after amorphous add --semiconductor--;
Claim 8, line 2, "hot" should be --host--;
Claim 23, line 7, after compensating delete "or altering"; line 10, after compensating add --or altering--;
Claim 26, line 3, "material or altering" should be --or altering material--;
Claim 29, line 3, the second occurrence of "and" should be --are--;
Claim 33, line 4, "or" should be --of--;
Claim 34, line 11, after materials add --comprising at least fluorine and--.

Signed and Sealed this

Twenty-second Day of January 1985

[SEAL]

Attest:

DONALD J. QUIGG

Attesting Officer  Acting Commissioner of Patents and Trademarks